(12) United States Patent
Bunyk (10) Patent No.: US 7,932,515 B2
(45) Date of Patent: Apr. 26, 2011

(54) QUANTUM PROCESSOR

(75) Inventor: Paul I. Bunyk, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 331 days.

(21) Appl. No.: 12/194,282

(22) Filed: Aug. 19, 2008

(65) Prior Publication Data

US 2009/0173936 A1     Jul. 9, 2009

Related U.S. Application Data

(60) Provisional application No. 61/018,820, filed on Jan. 3, 2008.

(51) Int. Cl.
*H01L 39/22* (2006.01)
*H03K 19/195* (2006.01)
*G11C 11/44* (2006.01)

(52) U.S. Cl. ............ 257/31; 326/3; 505/170
(58) Field of Classification Search .......... 257/31, 257/E39.014; 326/3; 505/170
See application file for complete search history.

(56) References Cited

U.S. PATENT DOCUMENTS

| 6,852,926 B2 | 2/2005 | Ma et al. | |
| 7,605,600 B2 * | 10/2009 | Harris | 326/1 |
| 2006/0147154 A1 * | 7/2006 | Thom et al. | 385/37 |
| 2008/0215850 A1 * | 9/2008 | Berkley et al. | 712/1 |
| 2009/0075825 A1 * | 3/2009 | Rose et al. | 505/170 |

OTHER PUBLICATIONS

Blatter et al., "Design aspects of superconducting-phase quantum bits," Physical Review B 63:174511-1-174511-9, 2001.
Farhi et al., "Quantum Adiabatic Evolution Algorithms versus Simulated Annealing," MIT-CTP #3228, arXiv: quant-ph/0201031 v1, pp. 1-16, Jan. 8, 2002.
Feynman, "Simulating Physics with Computers," International Journal of Theoretical Physics 21(6/7):467-488, 1982.
Friedman et al., "Quantum superposition of distinct macroscopic states," Nature 406:43-46, Jul. 6, 2000.
Il'ichev et al., "Continuous Monitoring of Rabi Oscillations in a Josephson Flux Qubit," Physical Review Letters 91(9):097906-1-097906-4, week ending Aug. 29, 2003.
Maassen van den Brink et al., "Mediated tunable coupling of flux qubits," New Journal of Physics 7:1-18, 2005.
Makhlin et al., "Quantum-State Engineering with Josephson-Junction Devices," Reviews of Modern Physics 73(2):357-400, 2001.
Miyazaki et al., "Development of SFQ Multi-Chip Modules for Quantum Bits," IEEE Transactions on Applied Superconductivity 17(2):158-161, 2007.
Mooij et al., "Josephson Persistent-Current Qubit," Science 285:1036-1039, Aug. 13, 1999.
Nielsen et al., Quantum Computation and Quantum Information, Cambridge University Press, Cambridge, 2000, "7.8 Other implementation schemes," pp. 343-345.
Orlando et al., "Superconducting Persistent-Current Qubit," Physical Review B 60(22):15 398-15 413, Dec. 1, 1999.
Shor, "Introduction to Quantum Algorithms," AT&T Labs—Research, arXiv:quant-ph/0005003 v2, pp. 1-17, Jul. 6, 2001.

* cited by examiner

*Primary Examiner* — Lex Malsawma
(74) *Attorney, Agent, or Firm* — Seed IP Law Group PLLC (57) ABSTRACT

Multiple substrates that carry quantum devices are coupled to provide quantum mechanical communicators therebetween, for example, using superconducting interconnects, vias, solder and/or magnetic flux. Such may advantageously reduce a footprint of a device such as a quantum processor.

20 Claims, 6 Drawing Sheets

QUANTUM PROCESSOR

CROSS REFERENCE TO RELATED APPLICATIONS

This application claims benefit under 35 U.S.C. 119(e) of U.S. Provisional Patent Application Ser. No. 61/018,820, filed Jan. 3, 2008 and entitled "Quantum Processor," which is incorporated herein by reference in its entirety.

BACKGROUND

1. Field

This disclosure generally relates to quantum computing and quantum processors, for example, multiple chip substrate quantum processors.

2. Description of the Related Art

A Turing machine is a theoretical computing system, described in 1936 by Alan Turing. A Turing machine that can efficiently simulate any other Turing machine is called a Universal Turing Machine (UTM). The Church-Turing thesis states that any practical computing model has either the equivalent or a subset of the capabilities of a UTM.

A quantum computer is any physical system that harnesses one or more quantum effects to perform a computation. A quantum computer that can efficiently simulate any other quantum computer is called a Universal Quantum Computer (UQC).

In 1981 Richard P. Feynman proposed that quantum computers could be used to solve certain computational problems more efficiently than a UTM and therefore invalidate the Church-Turing thesis. See e.g., Feynman R. P., "Simulating Physics with Computers", International Journal of Theoretical Physics, Vol. 21 (1982) pp. 467-488. For example, Feynman noted that a quantum computer could be used to simulate certain other quantum systems, allowing exponentially faster calculation of certain properties of the simulated quantum system than is possible using a UTM.

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Circuit model quantum computers have several serious barriers to practical implementation. In the circuit model, it is required that qubits remain coherent over time periods much longer than the single-gate time. This requirement arises because circuit model quantum computers require operations that are collectively called quantum error correction in order to operate. Quantum error correction cannot be performed without the circuit model quantum computer's qubits being capable of maintaining quantum coherence over time periods on the order of 1,000 times the single-gate time. Much research has been focused on developing qubits with coherence sufficient to form the basic information units of circuit model quantum computers. See e.g., Shor, P. W. "Introduction to Quantum Algorithms", arXiv.org:quant-ph/0005003 (2001), pp. 1-27. The art is still hampered by an inability to increase the coherence of qubits to acceptable levels for designing and operating practical circuit model quantum computers.

Another approach to quantum computation involves using the natural physical evolution of a system of coupled quantum systems as a computational system. This approach does not make critical use of quantum gates and circuits. Instead, starting from a known initial Hamiltonian, it relies upon the guided physical evolution of a system of coupled quantum systems wherein the problem to be solved has been encoded in the terms of the system's Hamiltonian, so that the final state of the system of coupled quantum systems contains information relating to the answer to the problem to be solved. This approach does not require long qubit coherence times. Examples of this type of approach include adiabatic quantum computation, cluster-state quantum computation, one-way quantum computation, quantum annealing and classical annealing, and are described, for example, in Farhi, E. et al., "Quantum Adiabatic Evolution Algorithms versus Simulated Annealing" arXiv.org:quant-ph/0201031 (2002), pp 1-16.

Qubits

As mentioned previously, qubits can be used as fundamental units of information for a quantum computer. As with bits in UTMs, qubits can refer to at least two distinct quantities; a qubit can refer to the actual physical device in which information is stored, and it can also refer to the unit of information itself, abstracted away from its physical device. Examples of qubits include quantum particles, atoms, electrons, photons, ions, and the like.

Qubits generalize the concept of a classical digital bit. A classical information storage device can encode two discrete states, typically labeled "0" and "1." Physically these two discrete states are represented by two different and distinguishable physical states of the classical information storage device, such as direction or magnitude of magnetic field, current, or voltage, where the quantity encoding the bit state behaves according to the laws of classical physics. A qubit also contains two discrete physical states, which can also be labeled "0" and "1." Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of $2^N$ states. Quantum algorithms make use of the superposition property to speed up some computations.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$, has the form $|\Psi\rangle=a|0\rangle+b|1\rangle$, where a and b are coefficients corresponding to the probabilities $|a|^2$ and $|b|^2$, respectively. The coefficients a and b each have real and imaginary components, which allows the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the $|0\rangle$ basis state or the $|1\rangle$ basis state and thus regaining its similarity to a conventional bit. The actual state of the qubit after it has collapsed depends on the probabilities $|a|^2$ and $|b|^2$ immediately prior to the readout operation.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Typical superconducting qubits, for example, have the advantage of scalability and are generally classified depending on the physical properties used to encode information including, for example, charge and phase devices, phase or flux devices, hybrid devices, and the like. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Patent Application No. 2005-0082519.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al, 1999, *Science* 285, 1036; and Orlando et al., 1999, *Phys. Rev.* B 60, 15398. Other examples of superconducting qubits can be found, for example, in Il'ichev et al., 2003, *Phys. Rev. Lett.* 91, 097906; Blatter et al., 2001, *Phys. Rev.* B 63, 174511, and Friedman et al., 2000, *Nature* 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junctions are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165 and US Provisional Patent Application Ser. No. 60/872,414 filed Jan. 12, 2007 and entitled "System, Devices and Methods for Interconnected Processor Topology."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. Provisional Patent Application 60/886,253 filed Jan. 23, 2007, entitled "SYSTEMS, DEVICES, AND METHODS FOR CONTROLLABLY COUPLING QUBITS." Respective coupling strengths of the coupling devices may be tuned between zero and a maximum value, for example, to provide ferromagnetic or anti-ferromagnetic coupling between qubits.

BRIEF SUMMARY

At least one embodiment may be summarized as a multi-chip processor including a first plurality of quantum devices carried by a first substrate; a second plurality of quantum devices carried by a second substrate; and a multi-substrate couplable quantum device coupled to a first quantum device of the first plurality of quantum devices and a second quantum device of the second plurality of quantum devices. At least one of a quantum device from the first plurality of quantum devices, a quantum device from the second plurality of quantum devices and the multi-substrate couplable quantum device may be a loop of superconducting material interrupted by at least one Josephson junction. The multi-substrate couplable quantum device may be configured to entangle the first quantum device of the first plurality of quantum devices with the second quantum device of the second plurality of quantum devices.

The multi-substrate couplable quantum device may include a first portion, a second portion and a third portion, the first portion of the multi-substrate couplable quantum device carried by the first substrate; the second portion of the multi-substrate couplable quantum device carried by the second substrate; and the third portion of the multi-substrate couplable quantum device that superconductingly connects the first portion to the second portion. The third portion may include at least two superconducting solder bumps situated between the first substrate and the second substrate. The third portion may further include at least two superconducting vias situated within the second substrate. The third portion may include superconducting wires within a multi-chip module. The first portion may be coupled to the first quantum device of the first plurality of qubits and the second portion is coupled to the second quantum device of the second plurality of qubits.

The multi-substrate couplable quantum device may be carried by the first substrate and wherein a first magnetic flux inductor is configured to couple flux from the multi-substrate couplable quantum device to a second magnetic flux inductor from the second quantum device of the second plurality of quantum devices. Each quantum device in at least one of the first plurality of quantum devices and the second plurality of quantum devices may be selected from the group consisting of: a qubit and a qubit coupler. The multi-substrate couplable quantum device may be a qubit. The qubit may be a superconducting flux qubit comprising a loop of superconducting material interrupted by at least one Josephson junction. The multi-substrate couplable quantum device may be a qubit coupler. The qubit coupler may be a superconducting flux qubit coupler comprising a loop of superconducting material interrupted by at least one Josephson junction.

The first substrate and the second substrate may be packaged within a multi-chip module. The first substrate may be packaged within a first multi-chip module and the second substrate is packaged within a second multi-chip module. The first multi-chip module may be stacked on the second multi-chip module.

The multi-chip processor may further include a second multi-substrate couplable quantum device coupled to a third quantum device of the first plurality of quantum devices and a fourth quantum device of the second plurality of quantum devices.

At least one embodiment may be summarized as a method of exchanging quantum information between a first plurality of quantum devices and a second plurality of quantum devices including coupling a multi-substrate couplable quantum device to the first quantum device from a first plurality of quantum devices carried by a first substrate; and coupling the multi-substrate couplable quantum device to the second quantum device from a second plurality of quantum devices carried by a second substrate. Coupling a multi-substrate couplable quantum device to the first quantum device from a first plurality of quantum devices carried by a first substrate may include threading the first quantum device with magnetic flux produced by current flowing within the multi-substrate couplable quantum device and threading the multi-substrate couplable quantum device with magnetic flux produced by current flowing within the first quantum device. Coupling a multi-substrate couplable quantum device to the second quantum device from a second plurality of quantum devices carried by a second substrate may include threading the second quantum device with magnetic flux produced by current flowing within the multi-substrate couplable quantum device and threading the multi-substrate couplable quantum device with magnetic flux produced by current flowing within the second quantum device. Coupling a multi-substrate couplable quantum device to the first quantum device may include coupling the multi-substrate couplable quantum device to one of a first qubit or a first qubit coupler and coupling the multi-substrate couplable quantum device to the second quantum device includes coupling the multi-substrate couplable quantum device to one of a second qubit or a second qubit coupler.

The multi-substrate couplable quantum device may be a multi-substrate couplable coupler qubit further including entangling the first and second qubits via the multi-substrate couplable qubit. The multi-substrate couplable qubit may be a superconducting flux qubit comprising a loop of superconducting material interrupted by at least one Josephson junction.

The multi-substrate couplable quantum device may a multi-substrate couplable qubit coupler further including entangling the first and the second quantum devices via the multi-substrate couplable qubit coupler. The multi-substrate couplable qubit coupler is a superconducting flux qubit coupler may include a loop of superconducting material interrupted by at least one Josephson junction. At least one of the first quantum device from the first plurality of quantum devices, a quantum device from the second plurality of quantum devices and the multi-substrate couplable quantum device may be a loop of superconducting material interrupted by at least one Josephson junction.

The method may further include entangling the first quantum device of the first plurality of quantum devices and the second quantum device of the second plurality of quantum devices via the multi-substrate couplable quantum device.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

For quantum computers to be scalable, coupling of qubits over more than one substrate may be required. Chip substrates of approximately 2 cm×2 cm may hold approximately 4000 physical qubits. If more than 4000 physical qubits are required to encode a problem, multiple chip substrates may be placed in close proximity to each other to facilitate the coupling of qubits carried by the multiple chip substrates. When two qubits from different respective chip substrates are coupled together, quantum information may pass from each coupled qubit, despite being carried by two different chip substrates.

Miyazaki et al., IEEE Transactions on Applied Superconductivity, Vol. 17, No. 2, 2007 discusses separating SFQ circuitry, carried by a first substrate, from superconducting quantum bits comprising Josephson junctions, carried by a second substrate, due to relatively high heat production inherent to SFQ circuits. If heat is present while the quantum bits of Miyazaki et al. operate, the decoherence time of the quantum bits will reduce thereby reducing the amount of time available to compute with the quantum bits. The superconducting quantum bits of Miyazaki et al. are all carried by a single substrate. No quantum information is passed between chip substrates; only classical information is transmitted from the SFQ circuitry to the superconducting quantum bits.

Passing quantum information between substrates opens up new scaling possibilities to quantum processor designers. Quantum information, however, is very susceptible to noise or decoherence. Decoherence occurs when a system interacts with its environment, or any complex external system, in such a thermodynamically irreversible way that ensures different elements in the quantum superposition is lost thereby losing quantum information. Proper shielding must be used to isolate the quantum processor from external magnetic fields of its environment. While superconducting shielding incorporated into the printed circuit board or substrate of a quantum processor chip, as discussed by U.S. Ser. No. 11/948,817, may limit magnetic field interactions on-chip, such superconducting shielding may not effectively shield the devices which pass quantum information between chip substrates. External magnetic shielding, as is described in, e.g., U.S. Ser. No. 60/981,763 and U.S. Ser. No. 60/984,321, may be used to limit magnetic field strengths in the vicinity of the quantum processor.

Heat is also a consideration when dealing with decoherence of quantum bits and quantum and classical information the quantum bits hold. The presence of heat may cause decoherence in quantum processors. While the programming of the quantum processor is likely to produce heat, such as with the use of SFQ circuitry or other types of programmable devices as is described in, e.g., U.S. Ser. No. 11/950,276, depending upon how the quantum processor is operated the quantum processor may be able to allow the heat produced during programming to dissipate and not affect the information held by the quantum bits.

Interconnected processor topologies have been described in, e.g., U.S. Publication No. 2006/0225165, U.S. Ser. No. 60/956,104 and U.S. Ser. No. 60/986,554. Each of the interconnected processor topologies allows for scalability of an interconnected topology upon one chip substrate. If about 4000 qubits can be carried by one substrate, for a quantum processor to incorporate more than 4000 qubits, multiple chip substrates may be coupled together. While it may be possible to employ larger chip substrates, the probability of defect may increase as a function of the number of individual qubits increases. A single defect may, in some situations, render the entire chip substrate or a portion of the entire chip defective. Thus, the use of multiple chip substrates of a relatively smaller size may be preferred to the use of a single, larger chip substrate.

Figure 1A:
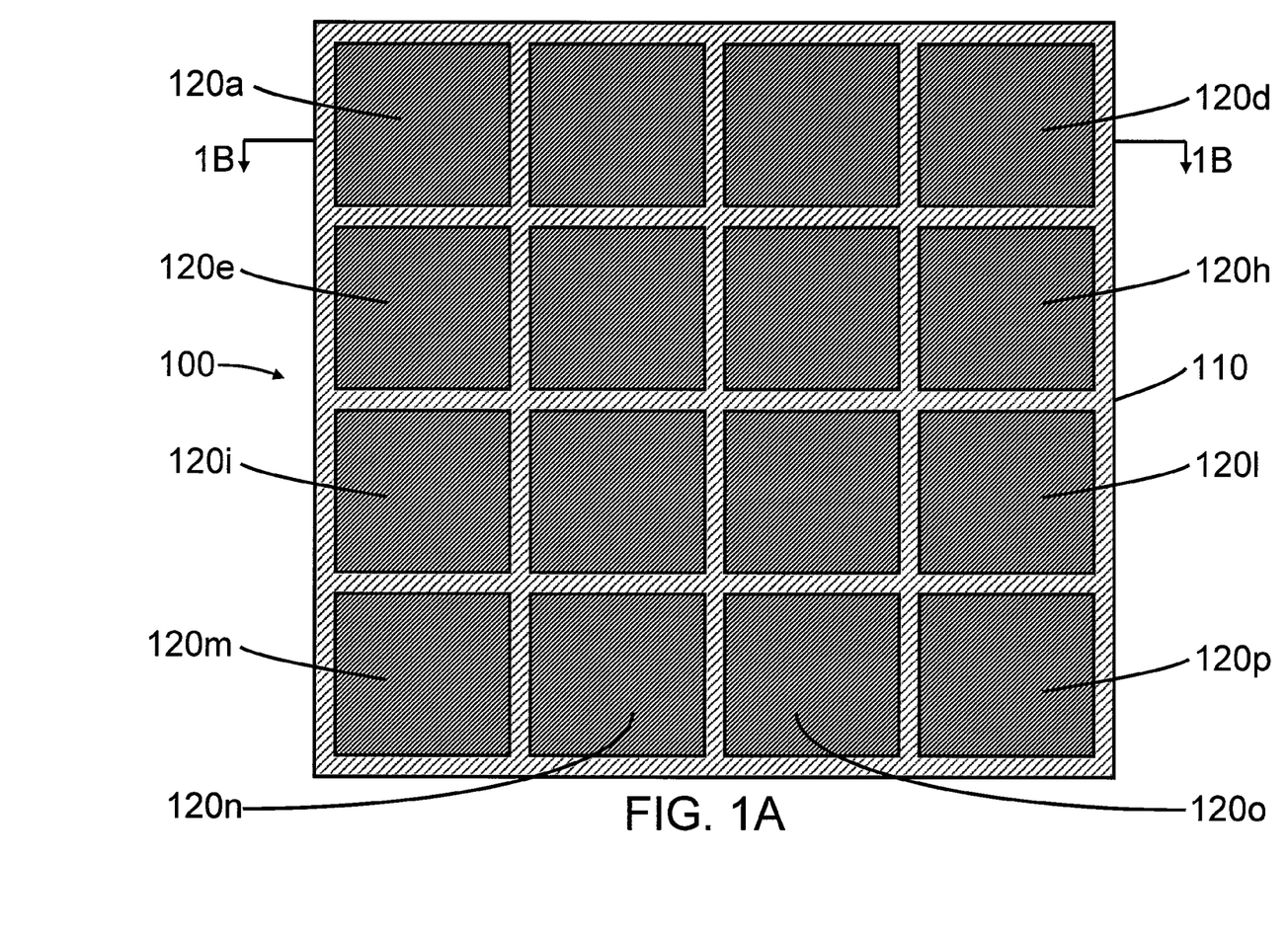
FIG. 1A is a schematic diagram of a quantum processor according to one illustrated embodiment.

FIG. 1A depicts a quantum processor 100 according to one illustrated embodiment. A multichip module (MCM) 110 has sixteen discrete substrates 120a-120p (collectively 120) packaged in such a way as to facilitate substrates 120 use as a single quantum processor 100. MCM 110 may be stacked in a vertical configuration with additional MCMs of similar configurations, making the stacked MCM footprint smaller than would have been required for a given number of substrates 120 packaged carried by a single MCM 110 (albeit at the cost of a thicker or taller quantum processor 100). This may allow for large numbers of substrates 120 to exist within a small footprint. While sixteen substrates 120 are shown in FIG. 1A, any number of substrates 120 may be designed into a MCM 110.

Figure 1B:
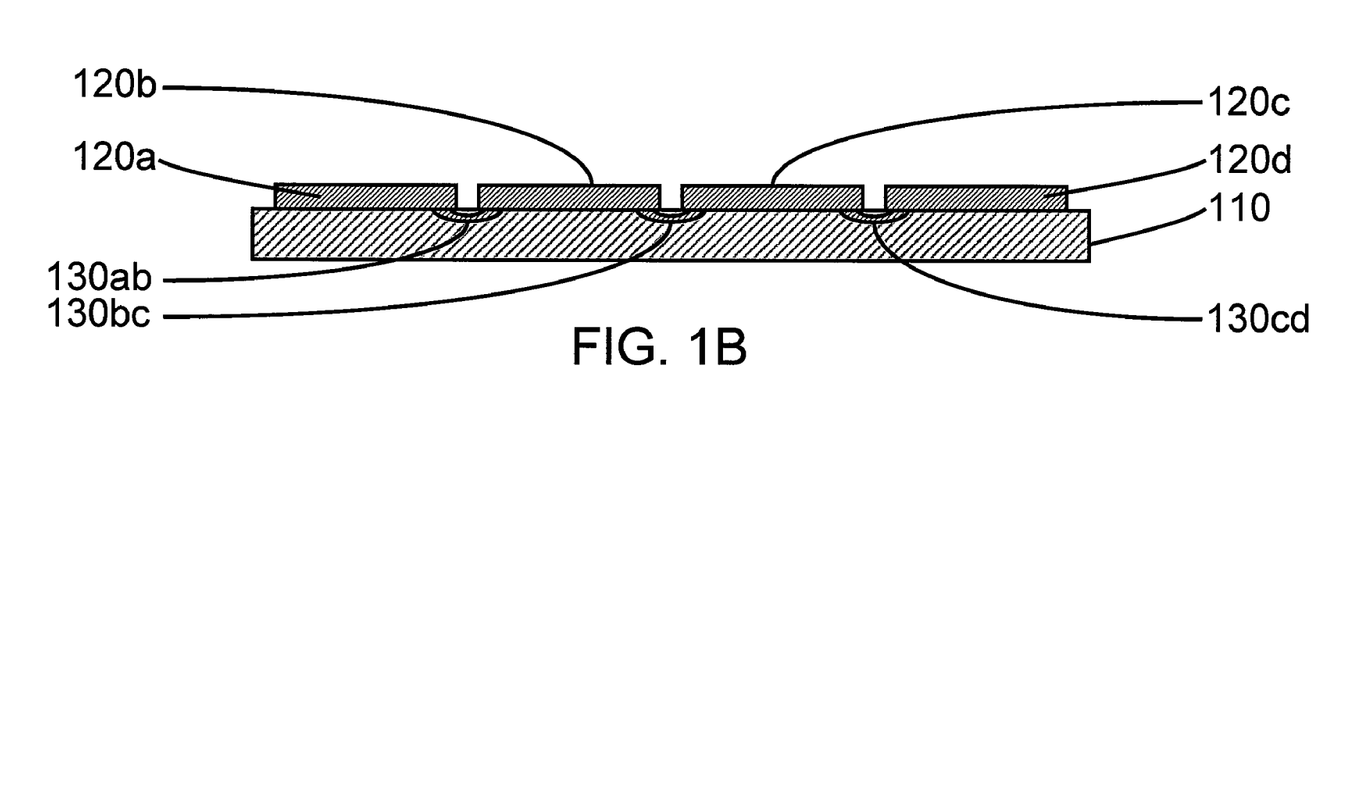
FIG. 1B is a cross-sectional view of a portion of the quantum processor of FIG. 1A taken along a section line 1B-1B.

FIG. 1B shows substrates 120a-120d carried by MCM 110. An interconnect 130ab is used to transmit quantum information between at least one device from substrate 120a and at least one device from substrate 120b. An interconnect 130bc is used to transmit quantum information between at least one device from substrate 120b and at least one device from substrate 120c. An interconnect 130cd is used to transmit quantum information between at least one device from substrate 120c and at least one device from substrate 120d.

Interconnect 130ab, 130bc, 130cd may be a quantum device or a portion of a quantum device. A quantum devices may be a qubit, such as superconducting qubit which may be a loop of superconducting material interrupted by at least one Josephson junction or compound Josephson junction, or a qubit coupler, such as a superconducting qubit coupler which may be loops of superconducting material interrupted by at lest one Josephson junction or compound Josephson junction. For discussions of coupling devices, see, e.g., U.S. Publication No. 2006/0147154, U.S. Patent Ser. No. 60/886,253, U.S. Patent Ser. No. 60/915,657, U.S. Ser. No. 60/975,083 and Maassen van den Brink et al., *New J. Phys.* 7 (November 2005) 230.

Interconnect 130ab may be two superconducting wires which connect two sections of a multi-substrate quantum device to form a loop, wherein a first section of the multi-substrate quantum device carried by substrate 120a has a magnetic flux inductor coupled to a first quantum device carried by substrate 120a and a second section of the multi-substrate quantum device carried by substrate 120b has a second magnetic flux inductor coupled to a second quantum device carried by substrate 120b. At least one Josephson junction or compound Josephson junction may interrupt the loop of superconducting material comprising the first section of the multi-substrate quantum device, the two wires of interconnect 130ab and the second section of the multi-substrate quantum device.

Interconnect 130bc may be two superconducting wires which connect two sections of a multi-substrate quantum device to form a loop, wherein a first section of the multi-substrate quantum device carried by substrate 120b has a magnetic flux inductor coupled to a first quantum device carried by substrate 120b, and a second section of the multi-substrate quantum device carried by substrate 120c has a second magnetic flux inductor coupled to a second quantum device carried by substrate 120c. At least one Josephson junction or compound Josephson junction may interrupt the loop of superconducting material comprising the first section of the multi-substrate quantum device, the two wires of interconnect 130bc and the second section of the multi-substrate quantum device.

Interconnect 130cd may be two superconducting wires which connect two sections of a multi-substrate quantum device to form a loop, wherein a first section of the multi-substrate quantum device carried by substrate 120c has a magnetic flux inductor coupled to a first quantum device carried by substrate 120c, and a second section of the multi-substrate quantum device carried by substrate 120d has a second magnetic flux inductor coupled to a second quantum device carried by substrate 120d. At least one Josephson junction or compound Josephson junction may interrupt the loop of superconducting material comprising the first section of the multi-substrate quantum device, the two wires of interconnect 130cd and the second section of the multi-substrate quantum device.

There may be an interconnect between each pair of substrates in quantum processor 100 such that each substrate 120 is connected to every other substrate 120 carried by MCM 110. There may be an interconnect between each pair of adjacent substrates (i.e., nearest and next-nearest neighbors)

in quantum processor 100, such that, for example, substrate 120m is connected to substrate 120i, substrate 120j, and substrate 120n. There may be an interconnect between each pair of substrates in a quantum processor which share a side (i.e., nearest neighbors), such that, for example, substrate 120m is coupled to substrate 120i and substrate 120n.

Figure 2A:
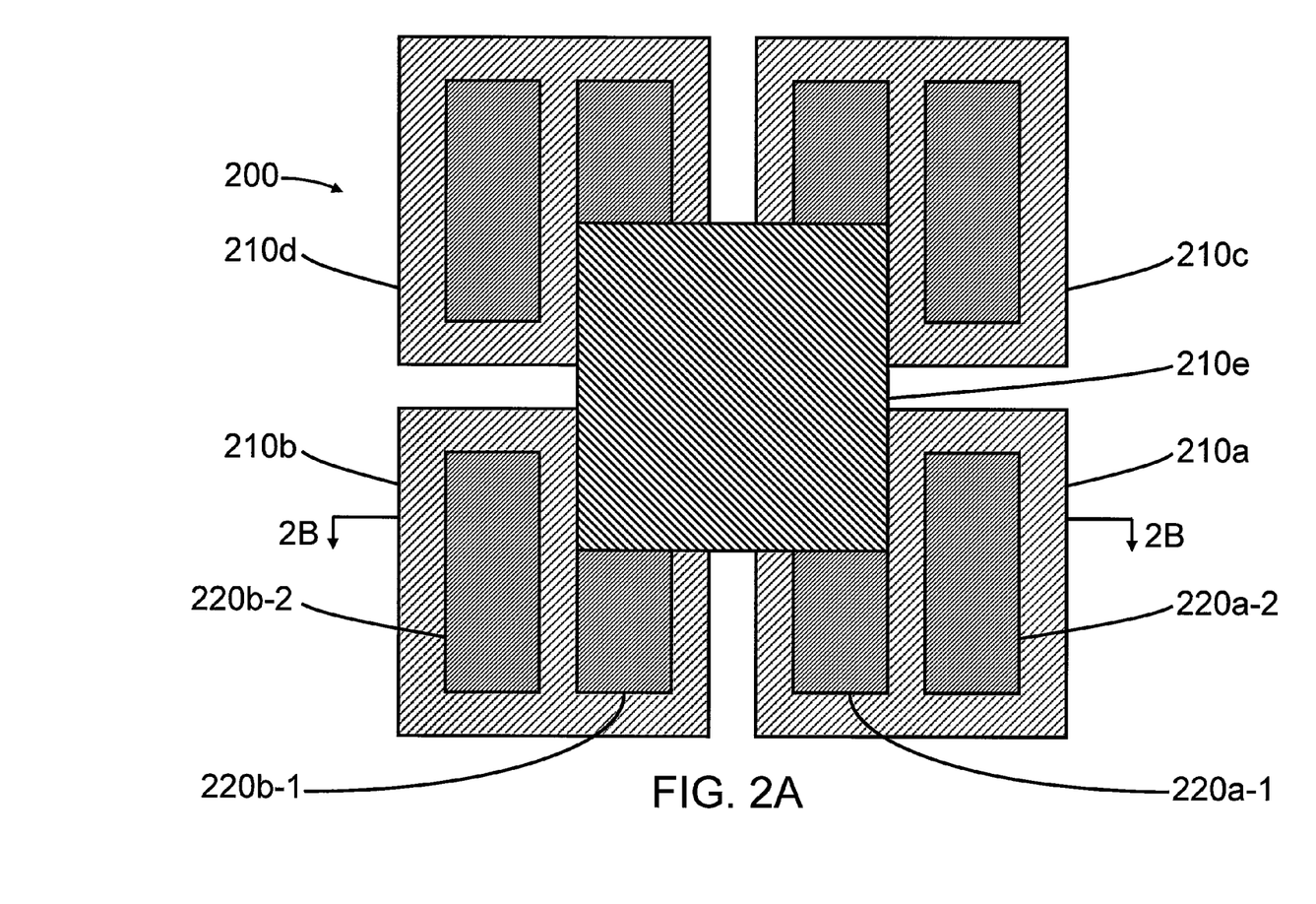
FIG. 2A is a schematic diagram of a quantum processor according to another illustrated embodiment.

FIG. 2A depicts a quantum processor 200 according to another illustrated embodiment. The stacked multi-chip arrangement depicted in FIG. 2A has five substrates 210a-210e (collectively 210) arranged in two levels, where the first level has substrates 210a-210d and the second level has substrate 210e, to facilitate use of substrates 210 as a single quantum processor 200. Additional levels may be stacked vertically. This may allow for large numbers of substrates 210 to exist within a fairly small footprint with a tighter packing than is available with a MCM. While four substrates 210a-210d are shown in the first level and one substrate 210e is shown in the second level of FIG. 1A, any number of substrates 210 may be designed into the first level and/or the second level. Quantum devices 220a-1 and 220a-2 are carried by substrate 210a. Quantum devices 220b-1 and 220b-2 are carried by substrate 210b. Each substrate 210 may carry a respective plurality of quantum devices 220.

Figure 2B:
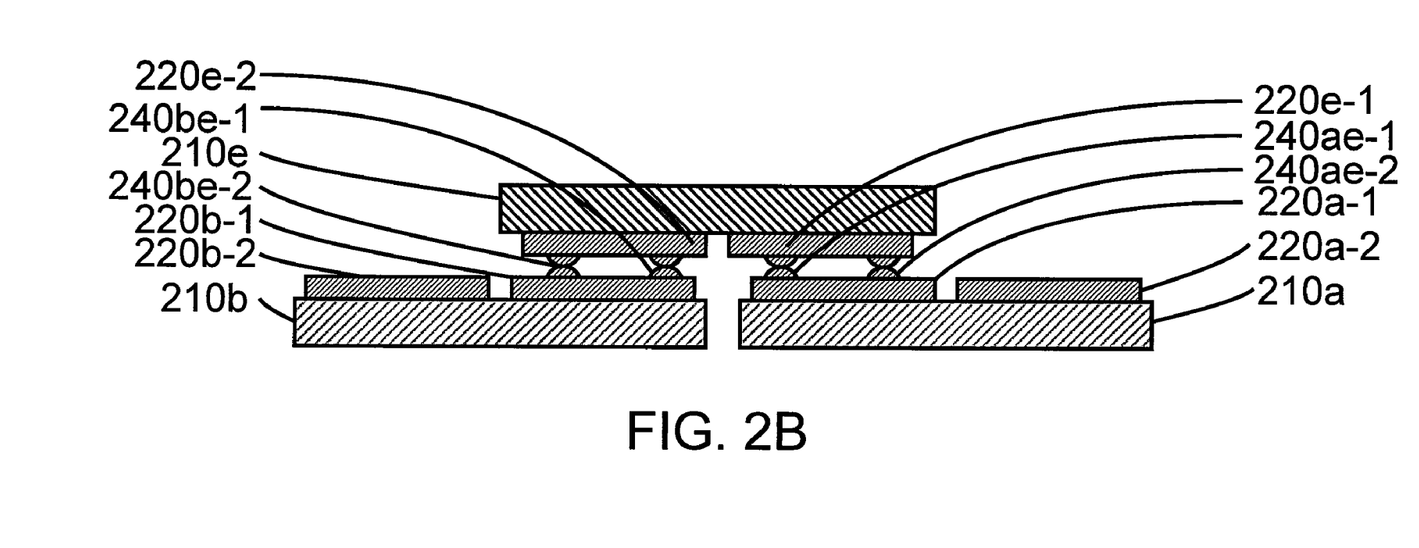
FIG. 2B is a cross-sectional view of a portion of a quantum processor of FIG. 2A taken along section line 2B-2B.

FIG. 2B shows the quantum processor 200 of FIG. 2A with substrate 210a, substrate 210b and substrate 210e coupled such that quantum information may be transferred from substrate 210a to substrate 210e, from substrate 210e to substrate 210a, from substrate 210b to substrate 210e, and from substrate 210e to substrate 210b. Quantum device 220a-2 is coupled to quantum device 220a-1 such that the state of quantum device 220a-2 may affect the state of quantum device 220a-1 and the state of quantum device 220a-1 may affect the state of quantum device 220a-2. Quantum device 220a-1 and quantum device 220a-2 are both carried by substrate 210a. Quantum device 220b-1 and quantum device 220b-2 are both carried by substrate 210b. Quantum device 220b-2 is coupled to quantum device 220b-1 such that the state of quantum device 220b-2 may affect the state of quantum device 220b-1 and the state of quantum device 220b-1 may affect the state of quantum device 220b-2. Quantum device 220e-1 and quantum device 220e-2 are both carried by substrate 210e. Quantum device 220e-2 is coupled to quantum device 220e-1 such that the state of quantum device 220e-2 may affect the state of quantum device 220e-1 and the state of quantum device 220e-1 may affect the state of quantum device 220e-2. Superconducting solder bumps 240ae-1 and 240ae-2 (collectively 240ae) may be used to connect quantum device 220a-1 with quantum device 220e-1 such that quantum device 220a-1, solder bumps 240ae, and quantum device 220e-1 collectively form a loop of superconducting material interrupted by at least one Josephson junction. Quantum device 220a-2 and quantum device 220e-2 may be quantum mechanically coupled to and entangled with each other, wherein quantum information passes between quantum device 220a-2 and quantum device 220e-2 though quantum device 220a-1, solder bumps 240ae and quantum device 220e-1. Superconducting solder bumps 240be-1 and 240be-2 (collectively 240be) may be used to connect quantum device 220b-1 with quantum device 220e-2 such that quantum device 220b-1, solder bumps 240be, and quantum device 220e-2 collectively form a loop of superconducting material interrupted by at least one Josephson junction. Quantum device 220b-2 and quantum device 220e-1 may be quantum mechanically coupled to and entangled with each other, wherein quantum information passes between quantum device 220b-2 and quantum device 220e-1 though quantum device 220b-1, solder bumps 240be and quantum device 220e-2. For a description of the transmission of single flux quantum (digital information) between superconducting chips, see, e.g., U.S. Pat. No. 6,678,540.

Quantum devices may be qubits, such as superconducting qubits which may be loops of superconducting material interrupted by at least one Josephson junction or compound Josephson junction, or qubit couplers, such as superconducting qubit couplers which may be loops of superconducting material interrupted by at lest one Josephson junction or compound Josephson junction. There may be many superconducting solder bumps 240ae coupling the quantum devices carried by substrate 210a and substrate 210e, such that quantum information may transmit between quantum devices carried by substrate 210a and quantum devices carried by substrate 210e. There may be many superconducting solder bumps 240be coupling the quantum devices carried by substrate 210b and substrate 210e, such that quantum information may transmit between quantum devices carried by substrate 210b and quantum devices carried by substrate 210e.

Superconducting solder bumps 240ae-1 and 240ae-2 may connect two sections of a multi-substrate quantum device together to form a loop, wherein a first section of the multi-substrate quantum device is carried by substrate 210a and has a magnetic flux inductor coupled to a first quantum device carried by substrate 210a and a second section of the multi-substrate quantum device carried by substrate 210e and has a magnetic flux inductor coupled to a second quantum device carried by substrate 210e. At least one Josephson junction, such as a compound Josephson junction, may interrupt the loop of superconducting material comprising the first section of the multi-substrate quantum device, the superconducting solder bumps 240ae-1 and 240ae-2 and the second section of the multi-substrate quantum device.

Superconducting solder bumps 240be-1 and 240be-2 may connect two sections of a multi-substrate quantum device together to form a loop, wherein a first section of the multi-substrate quantum device is carried by substrate 210b and has a magnetic flux inductor coupled to a first quantum device carried by substrate 210b and a second section of the multi-substrate quantum device carried by substrate 210e and has a magnetic flux inductor coupled to a second quantum device carried by substrate 210e. At least one Josephson junction, such as a compound Josephson junction, may interrupt the loop of superconducting material comprising the first section of the multi-substrate quantum device, the superconducting solder bumps 240be-1 and 240be-2 and the second section of the multi-substrate quantum device.

Figure 2C:
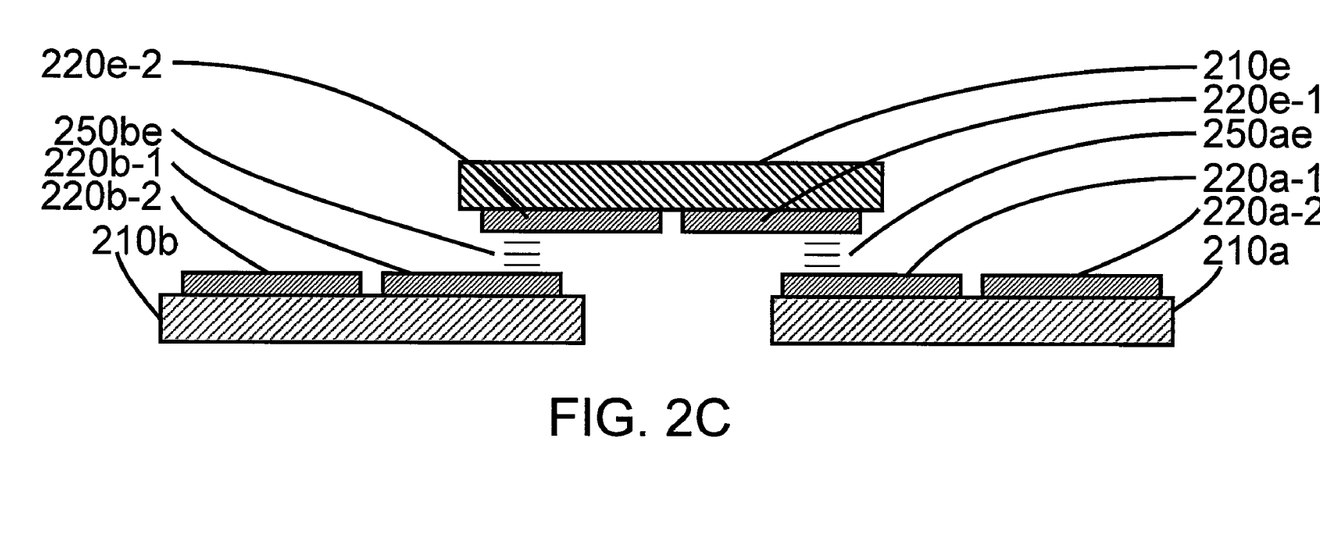
FIG. 2C is a cross-sectional view of a portion of a quantum processor of FIG. 2A taken along section line 2B-2B according to yet another illustrated embodiment.

FIG. 2C shows a portion of a quantum processor according to another illustrated embodiment where substrate 210a, substrate 210b and substrate 210e are coupled such that quantum information may be transferred from substrate 210a to substrate 210e, from substrate 210e to substrate 210a, from substrate 210b to substrate 210e, and from substrate 210e to substrate 210b. A quantum device 220a-2 is coupled to a quantum device 220a-1, and both quantum device 220a-1 and quantum device 220a-2 are carried by substrate 210a. Quantum device 220a-2 is coupled to quantum device 220a-1 such that the state of quantum device 220b-2 may affect the state of quantum device 220a-1 and the state of quantum device 220b-1 may affect the state of quantum device 220b-2. A quantum device 220b-2 is coupled to a quantum device 220b-1, and both quantum device 220b-1 and quantum device 220b-2 are carried by substrate 210b. Quantum device 220b-2 is coupled to quantum device 220b-1 such that the state of quantum device 220b-2 may affect the state of quantum device 220b-1 and the state of quantum device 220b-1 may affect the state of quantum device 220*b*-2. A quantum device 220*e*-2 is coupled to a quantum device 220*e*-1, and both quantum device 220*e*-1 and quantum device 220*e*-2 are carried by substrate 210*e*. Quantum device 220*e*-2 is coupled to quantum device 220*e*-1 such that the state of quantum device 220*e*-2 may affect the state of quantum device 220*e*-1 and the state of quantum device 220*e*-1 may affect the state of quantum device 220*e*-2. Magnetic flux 250*ae* may be used to couple quantum device 220*a*-1 and quantum device 220*e*-1 such that quantum device 220*a*-1 and quantum device 220*e*-1 may be quantum mechanically coupled to and entangled with each other, and wherein quantum information may pass between quantum device 220*a*-1 and quantum device 220*e*-1. A magnetic flux inductor from each quantum device 220*e*-1 and quantum device 220*a*-1 may be coupled together to allow for flux from quantum device 220*a* to thread into quantum device 220*e* and flux from quantum device 220*e* to thread into quantum device 220*a*. Magnetic flux 250*be* may be used to couple quantum device 220*b*-1 and quantum device 220*e*-2 such that quantum device 220*b*-1 and quantum device 220*e*-2 may be quantum mechanically coupled to and entangled with each other, and wherein quantum information may pass between quantum device 220*b*-1 and quantum device 220*e*-2. A magnetic flux inductor from each quantum device 220*e*-2 and quantum device 220*b*-1 may be coupled together to allow for flux from quantum device 220*b* to thread into quantum device 220*e* and flux from quantum device 220*e* to thread into quantum device 220*b*.

Quantum devices may be qubits, such as superconducting qubits which may be loops of superconducting material interrupted by at least one Josephson junction or compound Josephson junction, or qubit couplers, such as superconducting qubit couplers which may be loops of superconducting material interrupted by at lest one Josephson junction or compound Josephson junction.

Figure 2D:
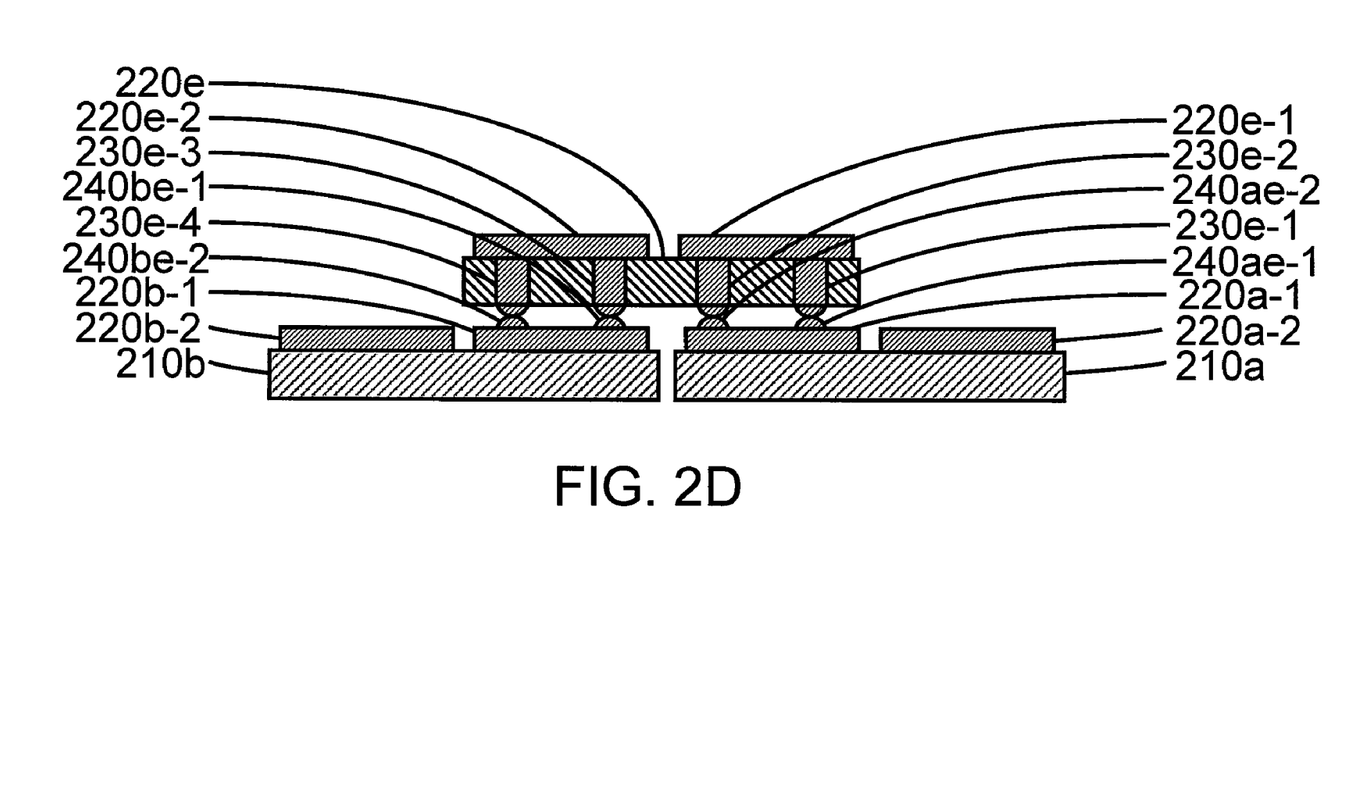
FIG. 2D is a cross-sectional view of a portion of a quantum processor of FIG. 2A taken along section line 2B-2B according to a further illustrated embodiment.

FIG. 2D shows a portion of a quantum processor according to a further illustrated embodiment where substrate 210*a*, substrate 210*b* and substrate 210*e* are coupled such that quantum information may be transferred from substrate 210*a* to substrate 210*e*, from substrate 210*e* to substrate 210*a*, from substrate 210*b* to substrate 210*e*, and from substrate 210*e* to substrate 210*b*. Superconducting vias 230*e*-1 to 230*e*-4 may be used to transfer quantum information from substrate 210*a* to substrate 210*e*, from substrate 210*e* to substrate 210*a*, from substrate 210*b* to substrate 210*e*, and from substrate 210*e* to substrate 210*b*. A quantum device 220*a*-2 is coupled to a quantum device 220*a*-1, and both quantum device 220*a*-1 and quantum device 220*a*-2 are carried by substrate 210*a*. Quantum device 220*a*-2 is coupled to quantum device 220*a*-1 such that the state of quantum device 220*b*-2 may affect the state of quantum device 220*a*-1 and the state of quantum device 220*b*-1 may affect the state of quantum device 220*b*-2. A quantum device 220*b*-2 is coupled to a quantum device 220*b*-1, and both quantum device 220*b*-1 and quantum device 220*b*-2 are carried by substrate 210*b*. Quantum device 220*b*-2 is coupled to quantum device 220*b*-1 such that the state of quantum device 220*b*-2 may affect the state of quantum device 220*b*-1 and the state of quantum device 220*b*-1 may affect the state of quantum device 220*b*-2. Superconducting solder bumps 240*ae*-1 and 240*ae*-2 (collectively 240*ae*) may be used to connect quantum device 220*a*-1 with quantum device 220*e*-1 such that quantum device 220*a*-2 and quantum device 220*e*-2 may be quantum mechanically coupled to and entangled with each other, wherein quantum information passes between quantum device 220*a*-2 and quantum device 220*e*-2 though quantum device 220*a*-1, solder bumps 240*ae* and quantum device 220*e*-1. Superconducting solder bumps 240*be*-1 and 240*be*-2 (collectively 240*be*) may be used to connect quantum device 220*b*-1 with quantum device 220*e*-2 such that quantum device 220*b*-2 and quantum device 220*e*-1 may be quantum mechanically coupled to and entangled with each other, wherein quantum information passes between quantum device 220*b*-2 and quantum device 220*e*-1 though quantum device 220*b*-1, solder bumps 240*be* and quantum device 220*e*-2. Superconducting solder bumps 240*ae*-1 and 240*ae*-2 (collectively 240*ae*) may be used to connect quantum device 220*a*-1 and quantum device 220*e*-1, through superconducting backside vias 230*e*-1 and 230*e*-2, such that quantum device 220*a*-2 and quantum device 220*e*-2 may be quantum mechanically coupled to and entangled with each other, wherein quantum information passes between quantum device 220*a*-2 and quantum device 220*e*-2. Superconducting solder bumps 240*be*-1 and 240*be*-2 (collectively 240*be*) may be used to connect quantum device 220*b*-1 and quantum device 220*e*-1, through superconducting backside vias 230*e*-3 and 230*e*-4, such that quantum device 220*b*-1, solder bumps 240*be*, superconducting backside vias 230*e*-3 and 230*e*-4, and quantum device 220*e*-2 collectively form a loop of superconducting material interrupted by at least one Josephson junction. Quantum device 220*b*-2 and quantum device 220*e*-1 may be quantum mechanically coupled to and entangled with each other, wherein quantum information passes between quantum device 220*b*-2 and quantum device 220*e*-1. For a description of the transmission of single flux quantum (digital information) between superconducting chips, see, e.g., U.S. Pat. No. 6,678,540.

Quantum devices may be qubits, such as superconducting qubits which may be loops of superconducting material interrupted by at least one Josephson junction or compound Josephson junction, or qubit couplers, such as superconducting qubit couplers which may be loops of superconducting material interrupted by at lest one Josephson junction or compound Josephson junction. There may be many superconducting solder bumps 240*ae* coupling the quantum devices carried by substrate 210*a* and substrate 210*e* and/or superconducting backside vias 230*e*-1 and 230*e*-2 within substrate 210*e* such that quantum information may transmit between quantum devices carried by substrate 210*a* and quantum devices carried by substrate 210*e*. There may be many superconducting solder bumps 240*be* coupling the quantum devices carried by substrate 210*b* and substrate 210*e* and/or superconducting backside vias 230*e*-3 and 230*e*-4 within substrate 210*e* such that quantum information may transmit between quantum devices carried by substrate 210*b* and quantum devices carried by substrate 210*e*.

Superconducting solder bumps 240*ae*-1 and 240*ae*-2 may connect two sections of a multi-substrate quantum device together to form a loop, wherein a first section of the multi-substrate quantum device is carried by substrate 210*a* and has a magnetic flux inductor coupled to a first quantum device carried by substrate 210*a* and a second section of the multi-substrate quantum device is carried by substrate 210*e* and has a magnetic flux inductor coupled to a second quantum device carried by substrate 210*e*. Superconducting backside vias 230*e*-1 and 230*e*-2 connect the second section of the multi-substrate quantum device to the superconducting solder bumps 240*ae*. At least one Josephson junction, such as a compound Josephson junction, may interrupt the loop of superconducting material comprising the first section of the multi-substrate quantum device, the superconducting backside vias 230*e*-1 and 230*e*-2, the superconducting solder bumps 240*ae*-1 and 240*ae*-2 and the second section of the multi-substrate quantum device.

Superconducting solder bumps 240be-1 and 240be-2 may connect two sections of a multi-substrate quantum device together to form a loop, wherein a first section of the multi-substrate quantum device is carried by substrate 210b and has a magnetic flux inductor coupled to a first quantum device carried by substrate 210b and a second section of the multi-substrate quantum device is carried by substrate 210e and has a magnetic flux inductor coupled to a second quantum device carried by substrate 210e. Superconducting backside vias 230e-3 and 230e-4 connect the second section of the multi-substrate quantum device to the superconducting solder bumps 240be. At least one Josephson junction, such as a compound Josephson junction, may interrupt the loop of superconducting material comprising the first section of the multi-substrate quantum device, the superconducting backside vias 230e-3 and 230e-4, the superconducting solder bumps 240be-1 and 240be-2 and the second section of the multi-substrate quantum device.

As used herein, the term "carried by" and variations thereof such as "carries" or "carrying" means that the quantum device is supported on, in or formed as part of the substrate.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other quantum processors and systems, not necessarily the exemplary quantum processors and systems generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. The present subject matter may, for example, be implemented via Application Specific Integrated Circuits (ASICs).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Pat. No. 6,838,694, U.S. Patent Publication No. 2005-0082519, US Patent Publication Number 2006-0225165, U.S. Provisional Patent Application Ser. No. 60/872,414 filed Jan. 12, 2007, entitled "System, Devices and Methods for Interconnected Processor Topology", U.S. Provisional Patent Application Ser. No. 60/956,104 filed Aug. 15, 2007 and entitled "Systems, Devices, and Methods for Interconnected Processor Topology", U.S. Patent Publication Number 2006-0147154, U.S. Provisional Patent Application Ser. No. 60/886,253 filed Jan. 23, 2007 and entitled "Systems, Devices, and Methods for Controllably Coupling Qubits", U.S. Provisional Patent Application Ser. No. 60/981,764, filed Oct. 22, 2007, entitled "Systems, Methods and Apparatus for Electronic Filters," U.S. Provisional Patent Application Ser. No. 60/979,031, filed Oct. 10, 2007, entitled "Systems, Methods and Apparatus for Multilayer Superconducting Printed Circuit Boards," and U.S. Provisional Patent Application Ser. No. 60/881,358 filed Jan. 18, 2007 and entitled "Input/Output System and Devices for Use with Superconducting Based Computing Systems," are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multi-chip processor comprising:
   a first plurality of quantum devices carried by a first substrate, wherein the first plurality of quantum devices includes a first set of qubits and a first set of couplers;
   a second plurality of quantum devices carried by a second substrate, wherein the second plurality of quantum devices includes a second set of qubits and a second set of couplers; and
   at least one multi-substrate coupler communicatively coupleable to a first quantum device of the first plurality of quantum devices and a second quantum device of the second plurality of quantum devices to couple quantum information therebetween.

2. The multi-chip processor of claim 1 wherein at least one of a quantum device from the first plurality of quantum devices, a quantum device from the second plurality of quantum devices and the multi-substrate coupler includes a loop of superconducting material interrupted by at least one Josephson junction.

3. The multi-chip processor of claim 1 wherein the multi-substrate coupler is configured to entangle the first quantum device of the first plurality of quantum devices and the second quantum device of the second plurality of quantum devices.

4. The multi-chip processor of claim 1 wherein the multi-substrate coupler comprises a first portion, a second portion and a third portion, the first portion of the multi-substrate coupler carried by the first substrate; the second portion of the multi-substrate coupler carried by the second substrate; and the third portion of the multi-substrate coupler superconductingly connects the first portion and the second portion.

5. The multi-chip processor of claim 4 wherein the third portion includes at least two superconducting solder bumps situated between the first substrate and the second substrate.

6. The multi-chip processor of claim 5 wherein the third portion further comprises at least two superconducting vias carried within the second substrate.

7. The multi-chip processor of claim 4 wherein the third portion includes superconducting wires within a multi-chip module.

8. The multi-chip processor of claim 4 wherein the first portion is communicatively coupleable to the first quantum device of the first plurality of quantum devices and the second portion is communicatively coupleable to the second quantum device of the second plurality of squantum devices.

9. The multi-chip processor of claim 1 wherein the multi-substrate coupler is carried by the first substrate and wherein a first magnetic flux inductor is configured to couple flux from the multi-substrate coupler to a second magnetic flux inductor from the second quantum device of the second plurality of quantum devices.

10. The multi-chip processor of claim 1 wherein at least one qubit from at least one of the first plurality of quantum devices and the second plurality of quantum devices is a superconducting flux qubit comprising a loop of superconducting material interrupted by at least one Josephson junction.

11. The multi-chip processor of claim 1 wherein the multi-substrate coupler is a superconducting coupler comprising a loop of superconducting material interrupted by at least one Josephson junction.

12. The multi-chip processor of claim 1 wherein the first substrate and the second substrate are packaged within a multi-chip module.

13. The multi-chip processor of claim 1 wherein the first substrate is packaged within a first multi-chip module and the second substrate is packaged within a second multi-chip module.

14. The multi-chip processor of claim 13 wherein the first multi-chip module is stacked on the second multi-chip module.

15. The multi-chip processor of claim 1, further comprising:
    at least a second multi-substrate coupler communicatively coupleable to at least a third quantum device of the first plurality of quantum devices and at least a fourth quantum device of the second plurality of quantum devices to couple quantum information therebetween.

16. A method of coupling quantum information between at least a first qubit carried by a first substrate and at least a second qubit carried by a second substrate, the method comprising:
    coupling quantum information from the first qubit carried by the first substrate to the second qubit carried by the second substrate via a first multi-substrate coupler; and
    coupling quantum information from the second qubit carried by the second substrate to the first qubit carried by the first substrate via the first multi-substrate coupler.

17. The method of claim 16 wherein coupling quantum information from the first qubit carried by the first substrate to the second qubit carried by the second substrate via a first multi-substrate coupler includes threading the first multi-substrate coupler with magnetic flux produced by current flowing within the first qubit carried by the first substrate and threading the second qubit carried by the second substrate with magnetic flux produced by current flowing within the first multi-substrate coupler.

18. The method of claim 16 wherein coupling quantum information from the second qubit carried by the second substrate to the first qubit carried by the first substrate via the first multi-substrate coupler includes threading the first multi-substrate coupler with magnetic flux produced by current flowing within the second qubit carried by the second substrate and threading the first qubit carried by the first substrate with magnetic flux produced by current flowing within the first multi-substrate coupler.

19. The method of claim 16, further comprising:
    entangling the first qubit carried by the first substrate and the second qubit carried by the second substrate via the first multi-substrate coupler.

20. The method of claim 16, further comprising:
    coupling quantum information from a third qubit carried by the first substrate to a fourth qubit carried by the second substrate via a second multi-substrate coupler; and
    coupling quantum information from the fourth qubit carried by the second substrate to the third qubit carried by the first substrate via the second multi-substrate coupler.

* * * * *